United States Patent
Gurvich et al.

(10) Patent No.: US 6,794,933 B2
(45) Date of Patent: Sep. 21, 2004

(54) FAST FORWARD RF POWER AMPLIFIER WITH HIGH EFFICIENCY MAIN AMPLIFIER AND HIGHLY LINEAR ERROR AMPLIFIER

(75) Inventors: Mark Gurvich, Costa Mesa, CA (US); Ezmarai Arbab, Laguna Niguel, CA (US); Bill Vassilakis, Tustin, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 10/365,111

(22) Filed: Feb. 12, 2003

(65) Prior Publication Data

US 2003/0151457 A1 Aug. 14, 2003

Related U.S. Application Data (60) Provisional application No. 60/357,496, filed on Feb. 14, 2002.

(51) Int. Cl.[7] .............................. H03F 3/66; H03F 1/26
(52) U.S. Cl. ......................................... 330/52; 330/151
(58) Field of Search ........................... 330/52, 149, 151

(56) References Cited

U.S. PATENT DOCUMENTS

| | | | |
|---|---|---|---|
| 4,389,618 A | 6/1983 | Bauman | 330/149 |
| 4,394,624 A | 7/1983 | Bauman | 330/149 |
| 5,166,634 A | 11/1992 | Narahashi et al. | 330/151 |
| 5,493,252 A | 2/1996 | Takai | 330/151 |
| 5,508,657 A | 4/1996 | Behan | 330/151 |
| 5,570,063 A | 10/1996 | Eisenberg | 330/151 |
| 5,617,061 A | 4/1997 | Fukuchi | 330/151 |
| 5,796,304 A | 8/1998 | Gentzler | 330/151 |
| 5,874,856 A | 2/1999 | Van Horn | 330/149 |
| 6,011,434 A | * 1/2000 | Sakai | 330/151 |
| 6,037,837 A | 3/2000 | Miyaji et al. | 330/149 |
| 6,078,216 A | 6/2000 | Proctor, Jr. | 330/151 |
| 6,081,156 A | 6/2000 | Choi et al. | 330/151 |
| 6,091,297 A | 7/2000 | Bar-David et al. | 330/151 |
| 6,104,241 A | 8/2000 | Cova et al. | 330/149 |
| 6,111,462 A | 8/2000 | Mucenieks et al. | 330/149 |
| 6,163,210 A | 12/2000 | Fukuchi | 330/151 |
| 6,198,346 B1 | 3/2001 | Rice et al. | 330/149 |
| 6,232,837 B1 | 5/2001 | Yoo et al. | 330/149 |
| 6,275,105 B1 | 8/2001 | Ghannouchi et al. | 330/149 |
| 6,275,106 B1 | 8/2001 | Gomez | 330/149 |
| 6,320,464 B1 | * 11/2001 | Suzuki et al. | 330/151 |
| 6,340,915 B1 | 1/2002 | Blodgett | 330/151 |
| 6,359,508 B1 | * 3/2002 | Mucenieks | 330/149 |
| 6,363,120 B1 | 3/2002 | Myer et al. | 375/254 |
| 6,417,731 B1 | * 7/2002 | Funada et al. | 330/149 |
| 6,525,603 B1 | * 2/2003 | Morgan | 330/52 |
| 6,590,449 B2 | * 7/2003 | Matsuura et al. | 330/149 |
| 2001/0020868 A1 | 9/2001 | Kim | 330/151 |

OTHER PUBLICATIONS

Feedforward—An Alternative Approach to Amplifier Linearization, T.J. Bennett, R.F. Clements, *The Radio and Electronic Engineer*, vol. 44, No. 5, May 1974.

* cited by examiner

*Primary Examiner*—Khanh Van Nguyen
(74) *Attorney, Agent, or Firm*—Myers Dawes Andras & Sherman, LLP (57) ABSTRACT

A feed forward RF power amplifier which provides both high efficiency and minimal distortion in broad bandwidth RF applications. The feed forward power amplifier includes a main amplifier biased to provide high efficiency and an error amplifier biased to provide highly linear operation through substantially the entire operating range. Signal peaks which introduce distortion components at the main amplifier output are cancelled by the linear operation of the error amplifier.

31 Claims, 4 Drawing Sheets

FIG. 7

FAST FORWARD RF POWER AMPLIFIER WITH HIGH EFFICIENCY MAIN AMPLIFIER AND HIGHLY LINEAR ERROR AMPLIFIER

RELATED APPLICATION INFORMATION

The present application claims priority under 35 USC 119(e) of provisional application serial No. 60/357,496 filed Feb. 14, 2002, the disclosure of which is incorporated herein by reference in its entirety.

BACKGROUND OF THE INVENTION

1. Field of the Invention

The present invention relates in general to wireless communication systems and methods and RF power amplifiers and methods.

2. Description of the Prior Art and Related Information

The two primary goals of RF power amplifier design are linearity over the range of power operation and efficiency. Linearity is simply the ability to amplify without distortion while efficiency is the ability to convert DC to RF energy with minimal wasted power and heat generation. Both these requirements are critical for modern wireless communication systems but it is increasingly difficult to provide both. This is due primarily to the bandwidth requirements of modern wireless communication systems which are placing increasing demands on amplifier linearity. As a practical matter the only way to provide the desired linearity has been to employ very large amplifiers operating in a low efficiency point of their operating range where they are more linear.

More specifically, linearization of RF power amplifiers is inherently difficult to achieve as RF power amplifiers use a large number of non-linear devices which become more and more nonlinear at increasingly higher output power levels. In practice, high power RF devices will generate substantial unwanted InterModulation Distortion (IMD) products which appear as spurious signals at the output of the RF power amplifier. Depending on the input signal type at the input of the power amplifier these unwanted signals may appear as spectral regrowth around the base of the wideband signal, e.g., in a CDMA (Code Division Multiple Access) system, or as additional carriers if more than one signal carrier is applied at the input of the amplifier. In general, wireless service providers around the world are subject to many governmental rules and regulations, which mandate very strict bandwidth usage. Spectrum constraints, as well as increasing output power levels drive performance requirements for RF power amplifiers. To meet these requirements large amplifiers operated in a highly linear but relatively inefficient point in their operating range have been used.

In addition to limiting IMDs in response to regulatory and signal quality requirements, RF power amplifiers employed in modern wireless communication systems must be efficient, i.e., must achieve good DC to RF conversion efficiencies, to avoid unnecessary power dissipation and heat. This requirement is increasing in importance driven by shrinking volumes of deployment facilities (e.g. cellular base stations), as well as reduction in heat exchanger size (or smaller air conditioning units), and reduction in operating noise levels due to cooling fans, as well as other factors. This need for efficiency clearly runs counter to the above noted need for large amplifiers operated at a linear but inefficient operating point to achieve desired linearity.

Figure 1:
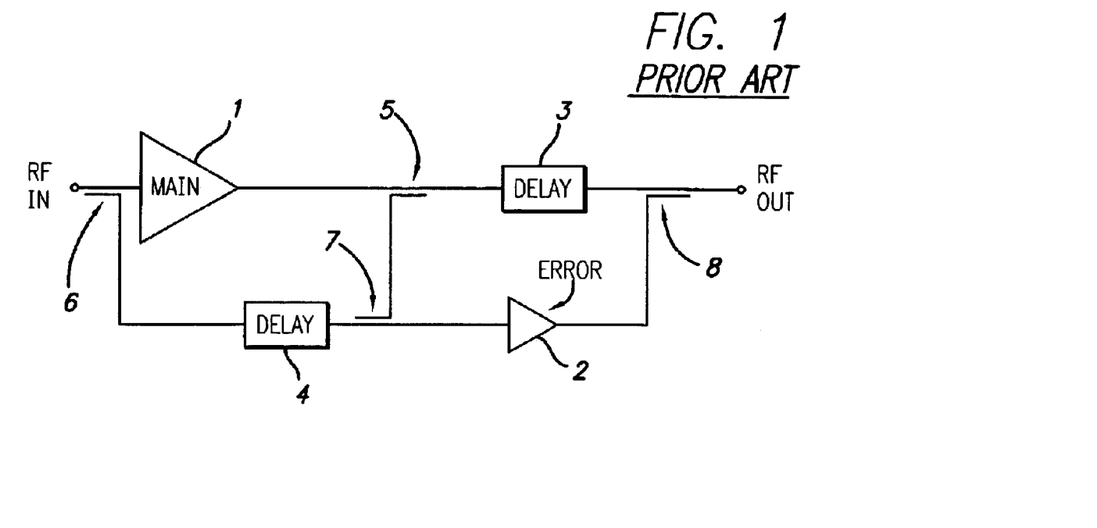
FIG. 1 is a block diagram of a prior art feed forward power amplifier.

Although there are many different approaches to achieving higher linearity and good efficiency in RF power amplifiers, feed forward amplifiers provide a common approach. In feed forward RF power amplifiers an error amplifier is employed to amplify only IMD products which are then combined with the main amplifier output to cancel the main amplifier IMDs. FIG. 1 illustrates a conventional feed forward amplifier design having a main amplifier 1 and an error amplifier 2. The basic elements also include delays 3, 4 in the main and error path, respectively, and main to error path couplers 5, 6, 7 and 8. Additional elements not shown are also typically present in a conventional feed forward architecture as is well known to those skilled in the art. The delays, couplers and error amplifier are designed to inject out of phase IMDs from the error path into the main amplifier output at coupler 8 to substantially eliminate the IMDs in the main amplifier path. Typically the main amplifier size in a feed forward system is chosen to be big enough to handle all or most signal peaks and the error amplifier size is relatively small as schematically illustrated in FIG. 1. For example, the error amplifier in conventional feed forward power amplifiers is typically about one ninth the size of the main amplifier. The average error amplifier power dissipation is thus quite small. Nonetheless, the main amplifier is large and its efficiency is quite low and thus the overall feed forward amplifier efficiency is quite low. An obvious way to improve main amplifier efficiency is to employ a smaller amplifier and drive it harder, however, this introduces unacceptably large IMDs for modern high bandwidth applications.

Therefore, a need presently exists for an RF power amplifier design which provides both high efficiency and minimal distortion in broad bandwidth RF applications.

SUMMARY OF THE INVENTION

The present invention provides a feed forward RF power amplifier design which provides both high efficiency and minimal distortion in broad bandwidth RF applications.

In a first aspect the present invention provides a feed forward amplifier comprising an RF input for receiving an RF signal and a main amplifier receiving and amplifying the RF signal, wherein the main amplifier is biased in a first bias class of operation. The feed forward amplifier also comprises a main amplifier output sampling coupler, a first delay coupled to the RF input and providing a delayed RF signal and a carrier cancellation combiner coupling the delayed RF signal to the sampled output from the main amplifier. The feed forward amplifier further comprises an error amplifier receiving and amplifying the output of the carrier cancellation combiner. The error amplifier is biased in a second bias class of operation with higher linearity than the first bias class. A second delay is coupled to the output of the main amplifier and an error injection coupler combines the output from the error amplifier and the delayed main amplifier output from the second delay so as to cancel distortion introduced by the main amplifier. An RF output is coupled to the error injection coupler output and provides an amplified RF output.

In a preferred embodiment the ratio of main amplifier to error amplifier size is from 2 to 1 or from 1 to 2. The first bias class of operation is preferably class C or class AB2 and the second bias class of operation is preferably class A or class AB1. The main amplifier may comprise one or more semiconductor amplifier devices, for example, plural LDMOS amplifier devices, and the device bias current in the first bias class of operation is preferably between 0 and 0.17 percent of device saturation current or between 1.25 and 2.50 percent of device saturation current. The error amplifier may also comprise one or more semiconductor amplifier devices, for example, plural LDMOS amplifier devices, and the device bias current in the second bias class of operation is preferably between 3.33 and 10.00 percent of device saturation current or between 10.00 and 25.00 percent of device saturation current. The feed forward amplifier may also further comprise a pre-distortion circuit coupled to the input of the main amplifier and a controller for controlling the operation of the pre-distortion circuit to minimize distortion at the amplifier RF output.

In another aspect the present invention provides a feed forward amplifier, comprising an RF input for receiving an RF input signal, the RF input signal having an average operating amplitude range and intermittent signal peaks in a peak range exceeding the average operating range. For example, the RF input signal may comprise a spread spectrum signal, such as a CDMA signal or a WCDMA signal, having randomly occurring signal peaks which comprise the peak signal range. The feed forward amplifier includes a main amplifier receiving and amplifying the RF input signal, the main amplifier having a first transfer characteristic over its range of operation. The first transfer characteristic has a substantially linear portion corresponding to the average operating amplitude range of the RF input signal and a nonlinear portion corresponding to the RF input signal peak range. The feed forward amplifier also includes a main amplifier output signal sampler, an error path delay circuit coupled to the RF input and providing a delayed RF input signal, and a first cancellation combiner coupling the delayed RF input signal to the sampled output from the main amplifier. The feed forward amplifier further includes an error amplifier for amplifying the output of the first cancellation combiner. The error amplifier has a second transfer characteristic over its range of operation, the second transfer characteristic having a linear portion corresponding to substantially all of the average and peak operating amplitude range of the RF input signal. The feed forward amplifier further includes a main path delay circuit coupled to the output of the main amplifier, a second cancellation combiner combining the output from the error amplifier and the output of the main path delay circuit so as to cancel distortion introduced by the main amplifier, and an RF output coupled to the second cancellation combiner and providing an amplified RF output.

In one specific implementation the range of operation of the error amplifier may be about 30 dB. The average power range of operation of the error amplifier may be about 10 dB. The power vs gain transfer characteristic of the error amplifier is preferably linear to less than 0.5 dB of gain through about 25 dB or more of the 30 dB operating range. Alternatively, the power vs gain transfer characteristic of the error amplifier may be linear up to about −4 to −5 dB from peak device power. The range of operation of the main amplifier may be from about −20 dB from peak power to peak power and the range of operation of the error amplifier may be from about −30 dB from peak power to peak power. The feed forward amplifier may further comprise a pre-distortion circuit coupled to the input of the main amplifier and a controller for controlling the operation of the pre-distortion circuit to minimize distortion at the amplifier output. The feed forward amplifier may further comprise a pilot signal generator providing a pilot signal to the input of the main amplifier and a pilot signal detector coupled to the amplifier output and the controller.

In another aspect the present invention provides a method for amplifying a broad bandwidth RF input signal. The method comprises receiving an RF input signal having an average operating amplitude range and intermittent signal peaks in a peak signal range exceeding the average operating range. For example, the RF input signal may comprise a spread spectrum signal having randomly occurring signal peaks which comprise the peak signal range. The method comprises amplifying the RF input signal employing a main amplifier having a first transfer characteristic over its range of operation, the first transfer characteristic having a substantially linear portion corresponding to the average operating amplitude range of the RF input signal and a nonlinear portion corresponding to the RF input signal peak range. The method further comprises sampling the main amplifier output, delaying the RF input signal and providing a delayed RF input signal, and coupling the delayed RF input signal to the sampled output from the main amplifier so as to provide a distortion component of the sampled output from the main amplifier. The method further comprises amplifying the distortion component employing an error amplifier having a second transfer characteristic over its range of operation, the second transfer characteristic having a linear portion corresponding to substantially all of the average and peak operating amplitude range of the RF input. The method further comprises delaying the output of the main amplifier, combining the amplified distortion component and the delayed output of the main amplifier so as to cancel distortion introduced by the main amplifier and providing an amplified RF output.

In a preferred embodiment, the range of operation of the error amplifier may be about 30 dB. The average power range of operation of the error amplifier may be about 10 dB. The power vs gain transfer characteristic of the error amplifier is preferably linear to less than 0.5 dB of gain through about 25 dB or more of the 30 dB operating range. Alternatively, the power vs gain transfer characteristic of the error amplifier may be linear up to about −4 to −5 dB from peak device power. The range of operation of the main amplifier may be from about −20 dB from peak power to peak power and the range of operation of the error amplifier may be from about −30 dB from peak power to peak power. The method may further comprise pre-distorting the RF input signal prior to amplifying by the main amplifier.

Further aspects of the invention will be appreciated from the following detailed description of the invention.

DETAILED DESCRIPTION OF THE INVENTION

Figure 2:
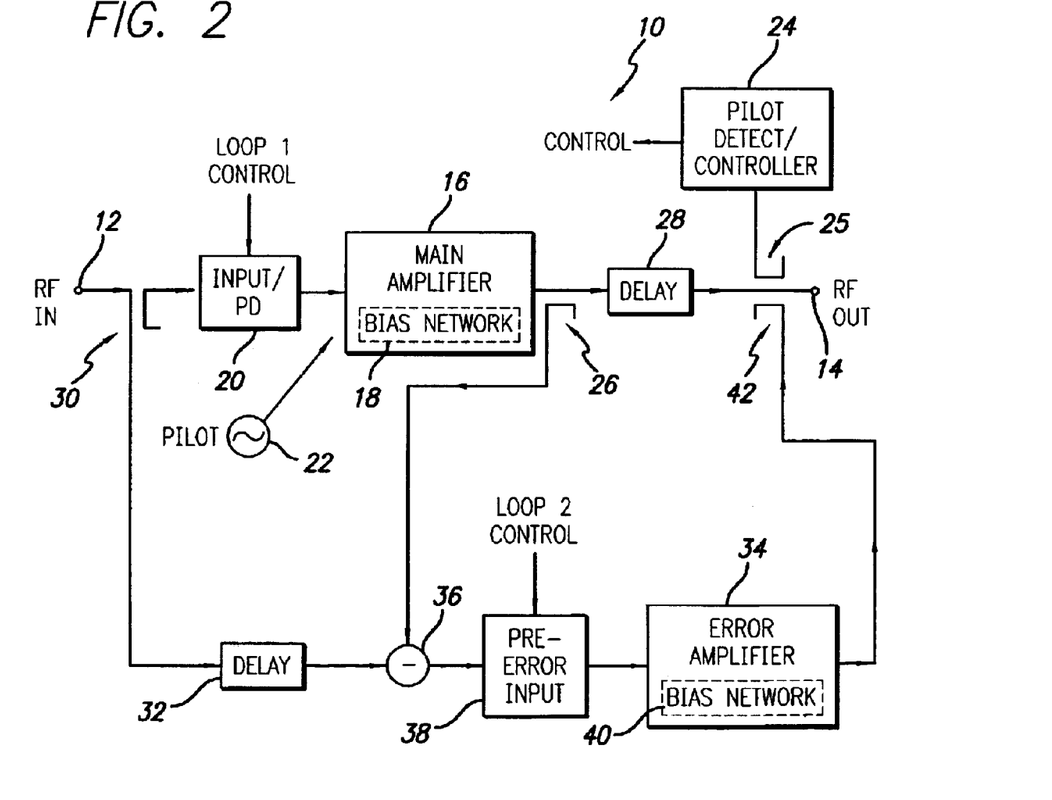
FIG. 2 is a block diagram of a preferred embodiment of a feed forward power amplifier in accordance with the invention.

A preferred embodiment of the invention is illustrated in FIGS. 2–6. Referring first to FIG. 2 the forward amplifier 10 is illustrated in a block schematic drawing. The feed forward amplifier 10 includes an input 12 which receives an input RF signal to be amplified and an output 14 which outputs the amplified RF signal. The RF signal may be a high bandwidth signal such as a CDMA (Code Division Multiple Access) spread spectrum communication signal or WCDMA (Wide Code Division Multiple Access) or other high bandwidth signal. In spread spectrum cellular systems such as CDMA or WCDMA a number of individual channels or users are combined and spread over a frequency spectrum by multiplying user data with a spreading code and then combining the channels. The spreading code is typically chosen to spread the data from an individual channel across a relatively wide frequency spectrum, within of course the spectrum range available to the given cellular provider. Since many individual channels are combined, the peak power of the overall signal provided to the amplifier 10 will depend on the individual amplitudes of the symbols being combined. It is statistically possible that the individual channel symbols will add to create very large combined symbol peaks. Although statistically not common, such very large symbol peaks must be accommodated in the overall system design. In the amplifier 10 these signal peaks are accommodated in an efficient manner by exploiting their relatively infrequent statistical nature, as will be discussed in detail below.

Still referring to FIG. 2, the input RF signal is split into a main amplifier signal path and an error amplifier signal path at input coupler 30 in accordance with well known feed forward amplifier design. The main amplifier signal path includes main amplifier 16 which is biased in a high efficiency mode of operation via bias network 18, as illustrated. More specifically, main amplifier 16 is biased at an operating power level and bias class so that good DC to RF conversion efficiency is provided and wasted power and heat are minimized. As a result, however, at least some of the signal peaks of the RF input signal will enter the nonlinear operating region of the amplifier transfer characteristic and the main amplifier will operate in a clipping mode introducing distortion for these signal peaks. These operating characteristics of the main amplifier 16 and the manner in which this distortion is handled by the error signal path will be discussed in more detail below.

The main amplifier signal path further includes input and pre-distortion circuitry 20. The input circuitry may include a preamplifier, group delay circuitry, and gain and phase control circuitry generally in accordance with conventional feed forward design. The pre-distortion circuitry in turn pre-distorts the input signal to reduce IMDs introduced by main amplifier 16. Although the pre-distortion circuitry 20 may be conventional in general design and operation, in combination with the main biasing it allows the main amplifier 16 to be operated even further into its nonlinear regime while controlling the amount of distortion. A pilot signal source 22 provides a pilot signal which is injected into the main amplifier input as illustrated and is used to control the input and pre-distortion circuitry 20. In particular, the pilot signal is extracted at the amplifier output by pilot sampling coupler 25 and used by controller 24 to control the input and pre-distortion circuitry 20 to minimize the pilot signal in the output signal and thereby minimize distortion in the output signal. The main amplifier signal path further includes a main amplifier output sample coupler 26 and delay 28, generally in accordance with conventional feed forward design. Additional details of the main amplifier signal path will be described below in relation to a detailed implementation illustrated in FIG. 7.

Still referring to FIG. 2, the error amplifier signal path includes input signal coupler 30 which samples the RF input signal and provides it to the error amplifier 34 via delay 32, attenuator/combiner 36 and pre-error input circuitry 38. More specifically, delay 32 and attenuator/combiner 36 operate as in a conventional feed forward amplifier such that the sampled output of the main amplifier 16 is attenuated and combined with the delayed input signal at attenuator/combiner 36 to substantially cancel all but the distortion component of the sampled signal from the main signal path. In some applications and implementations it may be advantageous to control the cancellation at attenuator/combiner 36 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error input circuitry 38. Pre-error input circuitry may include a preamplifier, group delay circuitry, and gain and phase control circuitry which operates similarly to circuitry 20. However, unlike circuitry 20 a pre-distortion circuit is not required in the error path due to the highly linear nature of the error amplifier.

The output of circuitry 38 is provided to error amplifier 34 which restores the magnitude of the sampled distortion components (IMDs) to that in the main signal path. Error amplifier 34 includes bias network 40 which controls the operating power range and bias class of error amplifier 34 so that it operates in a highly linear portion of its transfer characteristic. Since signal peaks in the input RF signal will create relatively large peak IMDs sampled from the main amplifier output, the error amplifier must be significantly larger than conventional feed forward error amplifiers. For example, the error amplifier may range from about one half the size of main amplifier 16 to twice the size of main amplifier 16. This is in contrast to conventional error amplifiers which are typically about one ninth the size of the main amplifier. Also, the error amplifier must be biased in a bias class which is of high linearity to ensure the operation is linear in the operating portion of the transfer characteristic. Since the bias class of the error amplifier is high, the error amplifier is inherently relatively inefficient in DC to RF conversion and the error amplifier is potentially a significant source of wasted power and undesired heat. Nonetheless, in practice it has been determined that the occurrence of signal peak related IMDs is sufficiently infrequent that the error amplifier only acts as a pulse amplifier and its impact on the efficiency of the overall amplifier is minimal.

Still referring to FIG. 2, the amplified distortion component output from error amplifier 34 is combined with the delayed main signal at 180 degrees (out of phase) with the main amplifier output at error injection coupler 42 to cancel the distortion component in the main signal path. A substantially distortion free amplified signal is then provided to the output 14. Any residual distortion is detected by the pilot detect circuitry 24 and used by the controller to provide control signals to circuitry 20 and 38 under the control of controller 24 which may be a suitably programmed microcontroller. These two controls may be essentially independent and may be viewed as control of two separate loops; loop 1 comprising circuitry 20, main amplifier 16, main amplifier output sample coupler 26, input signal coupler 30, group delay 32 and combiner 36, and loop 2 comprising sample coupler 26, attenuator/combiner 36, pre-error circuit 38, error amplifier 34, delay 28 and error injection coupler 42. More details on the loop control operation will be provided in relation to a preferred detailed implementation described in relation to FIG. 7.

Figure 3:
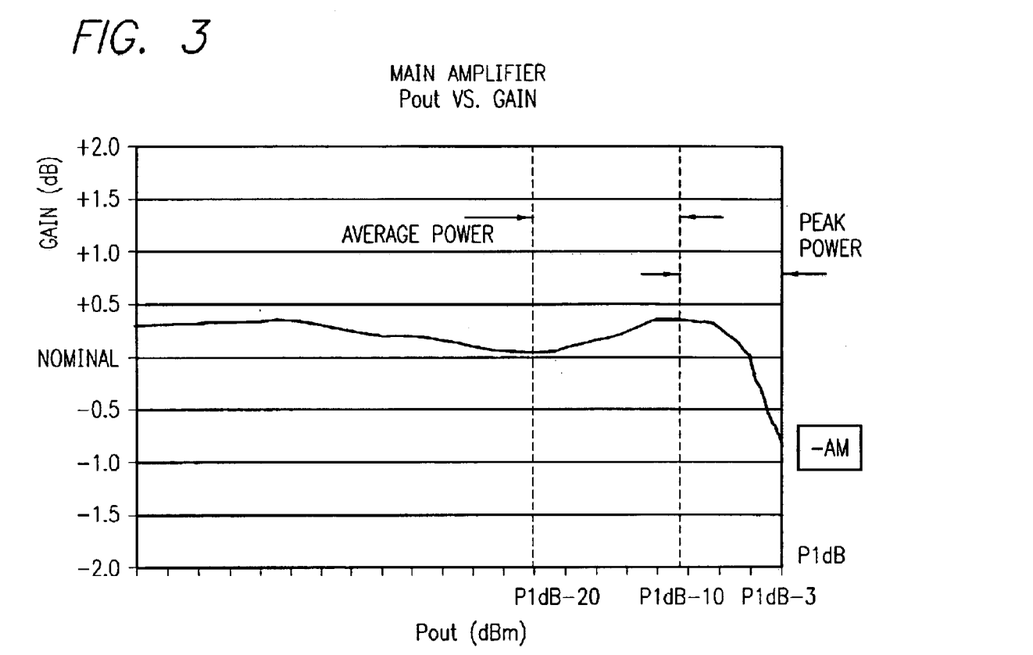
FIG. 3 is a plot of the transfer characteristic of the main amplifier in the feed forward power amplifier of FIG. 2 illustrating the gain characteristic over the operating range.

Referring next to FIGS. 3–6 and below Table 1, the operating characteristics of main amplifier 16 and error amplifier 34 will be described in more detail. These figures and Table 1 assume that 100 Watt P1 dB devices, specifically 100 Watt LDMOS (Laterally Diffused Metal Oxide Semiconductor) amplifier devices with saturation at about 1 dB, are used in the main and error amplifiers. Table 1 provides bias classes for the main amplifier and error amplifier in terms of quiescent bias currents (Idd) as a percentage of saturation current (Idss) for the amplifier devices. FIGS. 3–6 in turn illustrate the transfer characteristics for the main and error amplifiers over their operating range. Although these specific values correspond to one device example, i.e. 100 watt LDMOS P1 dB devices, these bias class characteristics, operating ranges and transfer curves will scale quite generally across both larger and smaller devices. Accordingly, these bias class definitions, operating ranges and transfer curves are not limited to the specific power example. Nonetheless, the bias class definitions of Table 1 may not specifically correspond to the Table 1 device parameters for all amplifier device types. The distinction between bias classes and the definition of class C, class AB2, class AB1 and class A are generally understood in the art for a wide variety of devices, however, and therefore the Table 1 device parameter values should be viewed as illustrative and not limiting in nature.

shown in FIG. 3, this nonlinearity is only about 0.5 dB gain or less through this average power region of the transfer curve; i.e., between P1 dB-20 and P1 dB-10 in the specific example illustrated. Therefore, this average power region may be characterized as a substantially linear region of the transfer curve. By the use of pre-distortion in the main path IMDs due to this nonlinearity can be substantially eliminated. Therefore, there will be minimal load on the error amplifier during operation in the average power region.

Figure 4:
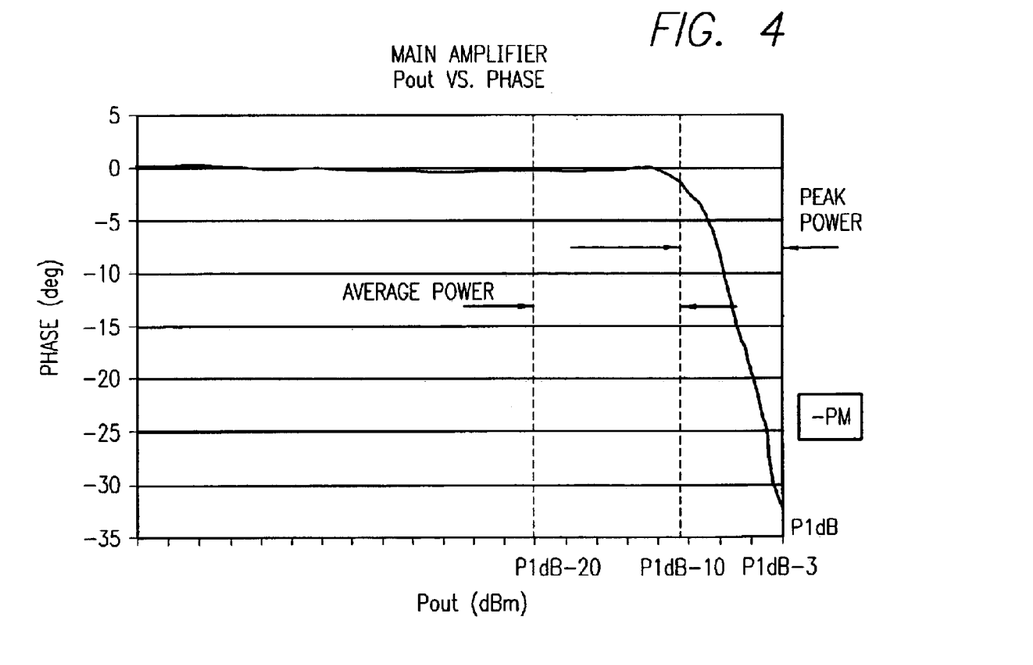
FIG. 4 is another plot of the transfer characteristic of the main amplifier in the feed forward power amplifier of FIG. 2 illustrating the phase response over the operating range.

The transfer curves of FIGS. 3 and 4 also show that the average power region of the main amplifier transfer curve is chosen relatively close to the saturation point of the amplifier. Therefore, for a given power requirement a smaller device can be used. Since smaller devices have lower current and draw less power the DC to RF efficiency is further increased. As may be seen from the transfer curves, however, while average signal power levels correspond to operation in the substantially linear portion of the transfer characteristic, the randomly occurring peak power signals are in a highly nonlinear portion of the transfer characteristic. This portion of the operating region corresponds to significant IMDs in the main amplifier output which are too large to be removed by pre-distortion in the main path. As discussed above, however, these signal peaks are relatively infrequent for typical high bandwidth signals, such as CDMA and WCDMA RF input signals. Therefore, the main amplifier 16 operates in a high efficiency substantially linear mode the majority of the time but generates intermittent large IMD products. These intermittent large IMD products in turn must be removed from the RF output by the operation of the error amplifier.

Referring to Table 1 and FIGS. 5–6, the error amplifier operating characteristics will next be described. Table 1

TABLE 1

Nominal Quiescent Bias Currents, per device, at 25° C.

12.0 Amp Idss

| Class of Operation | Main Min | | Main Max | | Error Min | | Error Max | |
|---|---|---|---|---|---|---|---|---|
| | Idd (Amp) | % Idss | Idd (Amp) | % Idss | Idd (Amp) | % Idss | Idd (Amp) | % Idss |
| C | 0.000 | 0.00% | 0.020 | 0.17% | | | | |
| AB2 | 0.150 | 1.25% | 0.300 | 2.50% | | | | |
| AB1 | | | | | 0.400 | 3.33% | 1.200 | 10.00% |
| A | | | | | 1.200 | 10.00% | 3.000 | 25.00% |

As may be seen from Table 1, the main amplifier is biased in a high efficiency class, specifically Class C or lower Class AB (AB2). This provides the desired maximum DC to RF conversion efficiency for a given device size. In addition to reducing wasted power, this DC to RF efficiency increases reliability. More specifically, when modern RF power devices such as LDMOS amplifier devices are operated at higher efficiency levels this directly translates into lower junction temperature. Reduction in junction temperature greatly increases the mean lifetime of the device and thus improves overall reliability of the feed forward power amplifier system. The transfer curves of FIGS. 3 and 4 in turn show that some nonlinearity in the transfer characteristic occurs throughout the normal or average power operating range of the main amplifier due to the biasing class of the main amplifier (especially in the power vs gain transfer curve). This nonlinearity will introduce some distortion (IMDs) through the normal operating range. However, as shows that the bias class for the error amplifier is significantly higher than for the main amplifier, e.g., higher AB (AB1) or Class A. Also, the size of the error amplifier is selected so that the majority of the operating range is well away from the nonlinear portion of the transfer curve near peak power. In some demanding applications the error amplifier may be larger than the main amplifier, up to about double the main amplifier size. Alternatively, in less demanding applications the error amplifier may be smaller than the main amplifier, e.g., about half the main amplifier. This combination of error amplifier size and bias class provides a linear transfer characteristic for the error amplifier over substantially all of its operating range, including signal peaks, as shown in FIGS. 5 and 6. This allows the error amplifier to accurately amplify peak signal IMDs so as to cancel the main amplifier distortion. Therefore, amplifier 10 provides an RF output substantially free of IMDs throughout the operating range of the RF input, including signal peaks. Although the bias class and operating range of the error amplifier are selected for maximum linearity and not efficiency, nonetheless the overall efficiency of the feed forward amplifier will not be significantly affected since the signal peaks are intermittent in nature. That is, the error amplifier effectively acts in a pulse mode with relatively low total power consumption.

Figure 5:
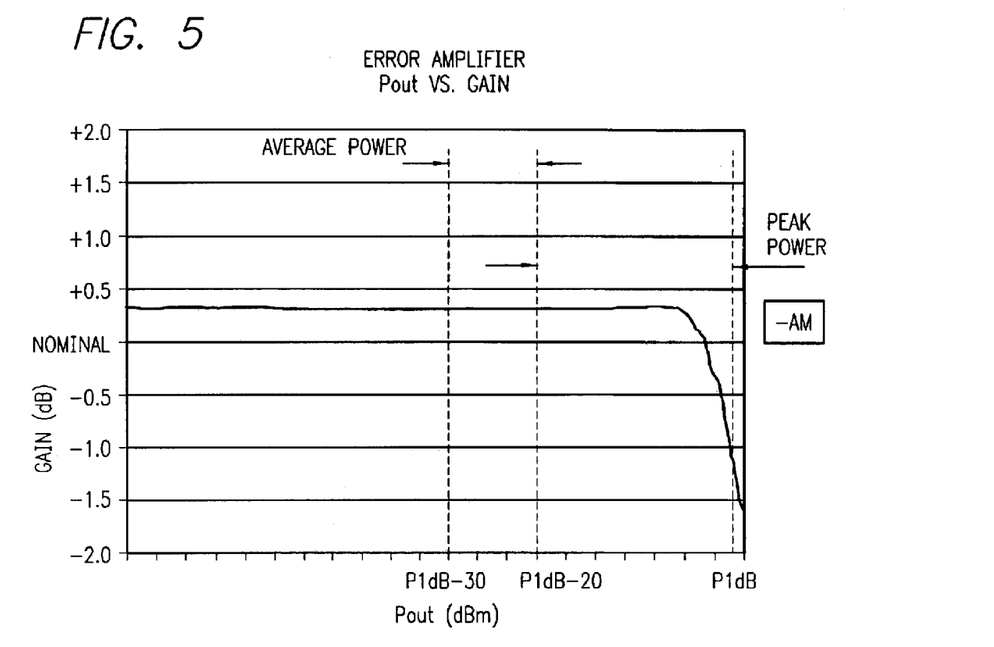
FIG. 5 is a plot of the transfer characteristic of the error amplifier in the feed forward power amplifier of FIG. 2 illustrating the gain characteristic over the operating range.
Figure 6:
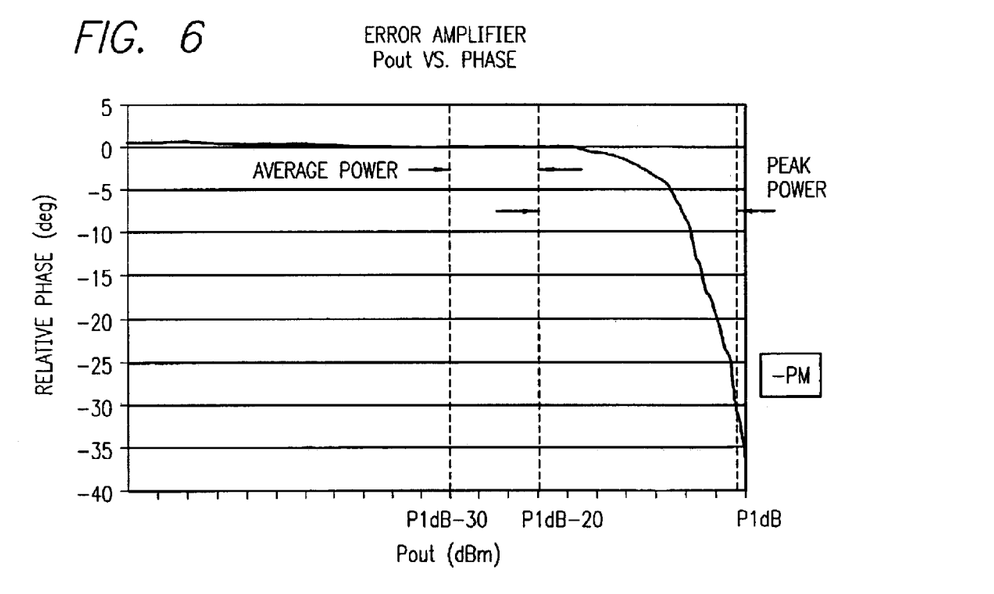
FIG. 6 is another plot of the transfer characteristic of the error amplifier in the feed forward power amplifier of FIG. 2 illustrating the phase response over the operating range.

Although the error amplifier transfer curve of FIG. 5 shows a linear response through less than all the operating range, about 25–26 dB of the 30 dB operating range (i.e., to about −4 to −5 dB from peak device power taken to be 1 dB) in practice this will catch virtually all of the signal peak IMDs since peaks outside this power range will be extremely rare. Nonetheless, this linear range may be varied somewhat depending on the statistics of the peak power pulses for the specific type of RF input signal and the IMD tolerance of the particular application. The phase response of FIG. 6 is less critical but again the linear region may varied with the application. In particular, the linear portion of the operating range of the error amplifier transfer curve may be increased by increasing the size of the error amplifier thereby moving the entire operating range further to the left in FIGS. 5 and 6. Therefore, it will be appreciated that if needed for a particular application the linear portion of the error amplifier transfer curve may extend through the entire operating range including the entire peak signal range.

Accordingly, it will be appreciated that the present invention provides a feed forward amplifier with high efficiency and minimal wasted power and unwanted heat generation while at the same time providing the high degree of linearity needed for wide bandwidth applications.

Figure 7:
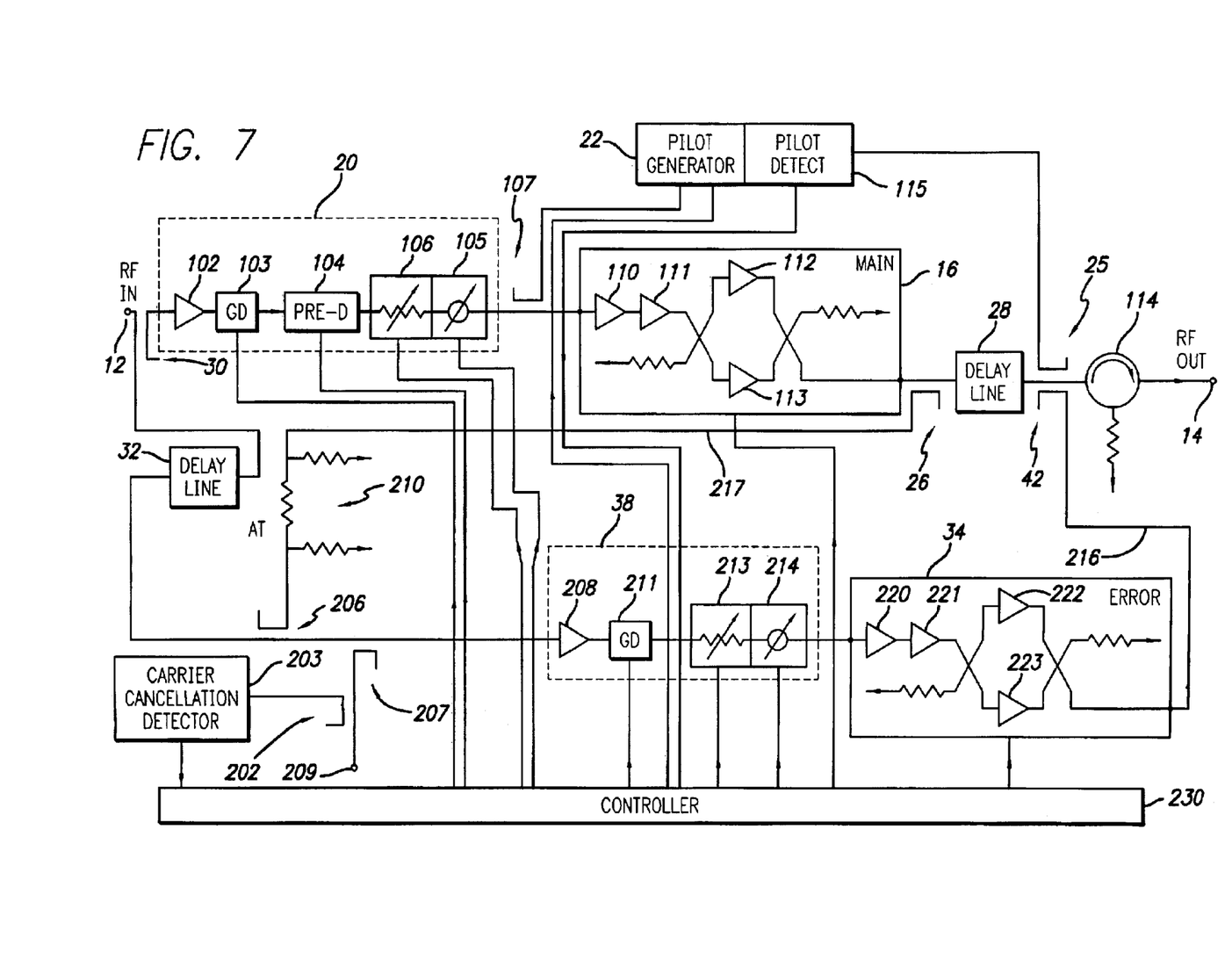
FIG. 7 is a detailed schematic drawing of one preferred implementation of a feed forward power amplifier in accordance with the invention.

Referring to FIG. 7, a specific implementation of the feed forward power amplifier of FIG. 2 is illustrated. This specific embodiment corresponds to equal size main and error amplifier modules 16, 34, respectively, although the operating characteristics of the two modules will be very different as discussed in detail above. This may have cost advantages due to the use of the same basic amplifier module configuration, thereby avoiding separate design and tooling costs and costs associated with separate manufacturing steps for the two modules. Performance requirements may offset the cost advantages in certain applications, however, and the ratio of main to error amplifier size may be from one-to-two to two-to-one, as discussed above. Also, the specific implementation of FIG. 7 shows a specific dual control loop configuration including main and error path predistortion, which may reduce distortion due to signal peaks and improve overall amplifier efficiency.

More specifically, as illustrated in FIG. 7 the main amplifier path includes RF input 12, input signal coupler 30, input and pre-distortion circuitry 20, pilot injection coupler 107, main amplifier power module 16, main amplifier output sample coupler 26, group delay line 28, error injection coupler 42, pilot detect coupler 25, isolator 114, and RF output 14. The input and pre-distortion circuitry 20 in the illustrated embodiment comprises distributed small signal gain stages 102, group delay adjusting circuit 103, pre-distortion circuits 104, phase control circuit 105, and amplitude control circuit 106. Distributed small signal gain stages 102 may be conventional and operate to provide a small initial gain to the RF input signal. Group delay adjusting circuit 103, pre-distortion circuit 104, phase control circuit 105, and amplitude control circuit 106 operate under the control of controller 230 which may be a suitably programmed microcontroller. Controller 230 receives the detected pilot signal from pilot detect circuit 115 and employs this signal to adjust the group delay adjusting circuit 103, pre-distortion circuit 104, phase control circuit 105 and amplitude control circuit 106 to minimize the pilot signal and hence minimize distortion. Controller 230 also may provide a signal to pilot generator 22 which is used to create the pilot signal. In accordance with typical feed forward control this action may be best described as one loop of a two loop control process as discussed below. The main amplifier power module 16 includes main amplifier stages 110, 111, 112, and 113 biased, as discussed in relation to Table 1 above, in class C or AB2. This four stage implementation corresponds to four separate devices; e.g. a pre-amplifier 110, an intermediate power amplifier 111, and two large power amplifiers 112, 113, e.g. 100 Watt 1 dB main amplifier LDMOS stages. It will be appreciated that more or fewer stages may be employed depending on the application and power requirements and on the available stage amplifiers performance and cost.

Still referring to FIG. 7, the error amplifier path includes group delay line 32, carrier cancellation offset injection coupler 202, carrier cancellation detector 203, carrier cancellation coupler 206, error input signal sample coupler 207, error input signal test port 209, pre-error input 38, error amplifier power module 34, and output error amplifier interconnection lines 216 to the error injection coupler 42. The carrier cancellation coupler 206 receives the sampled and attenuated main amplifier output from main amplifier output sample coupler 26, main sampled signal attenuator 210 and associated RF interconnections 217. The carrier cancellation detector 203 detects the amount of RF carrier in the error path and provides this as an input to controller 230. A test signal may be applied to the error path via test port 209. The pre-error input circuitry 38 comprises distributed small signal gain stages 208, group delay adjuster circuit 211, phase adjustment circuit 214 and amplitude adjustment circuit 213. The distributed small signal gain stages 208 may be conventional in operation. The group delay adjuster circuit 211, phase adjustment circuit 214 and amplitude adjustment circuit 213 operate under the control of controller 230, as discussed below. The error signal is provided from pre-error input circuitry 38 to error amplifier power module 34. Error amplifier power module 34 comprises stages 220, 221, 222, and 223 corresponding to the main module 16 layout in the illustrated equal size main and error implementation. These stages 220, 221, 222, and 223 may comprise devices, e.g. LDMOS amplifier devices, of the same size as in the main module but differently biased. In particular, as discussed above in relation to Table 1, the stages 220, 221, 222, and 223 may comprise LDMOS amplifiers biased in class AB1 or A. This will provide highly linear amplification of the error signal for current high bandwidth applications. If future even higher bandwidth requirements or higher power applications increase the error signal input the error amplifier size may be increased to maintain the linearity across the operating range, as discussed above in relation to FIGS. 5 and 6. The amplified error signal is then applied via error amplifier output interconnection lines 216 to the error injection coupler 42 where it cancels IMDs in the main path.

The following discussion of the specific control implementation of FIG. 7 will clarify the use of the controller 24 and circuitry 20 and 38 to help achieve desired IMD performance. As discussed above, this control may be viewed as separate control of two loops in accordance with conventional feed forward control terminology. The first control loop (or loop 1) is the carrier cancellation loop in accordance with conventional terminology. Loop 1 contains the following circuit elements:

Input signal coupler 30
Distributed small signal gain stages 102
Main path group delay adjusting circuit 103
Main path pre-distortion circuit 104
Main path phase 105 and amplitude 106 control circuits
Pilot injection coupler 107
Main amplifier power module 16
Main amplifier output sample coupler 26
Associated main output RF interconnections 217
Sampled signal attenuator 210
Group delay line 32
Carrier cancellation offset injection coupler 202
Carrier cancellation detector 203
Carrier cancellation coupler 206
Error input signal sample coupler 207
Error input signal test port 209.

Loop 1 carrier cancellation detector 203 behavior is similar to a conventional feed forward power amplifier system. The controller 230 adjusts the group delay circuit 103 and phase and amplitude control circuits 105, 106 to set the detected carrier signal at carrier cancellation circuit 203 to a desired level. Controller 230 may operate so that when the carrier cancellation is adjusted there is a minimum amount of RF energy incident upon the input of the carrier cancellation circuit 203. As noted above, however, in some applications it may be advantageous to adjust the carrier cancellation so that some RF carrier component remains. Loop 1 pre-distortion circuit 104 is controlled by controller 230 by monitoring the pilot signal from pilot detect circuit 115 to minimize the detected pilot signal.

Loop 2 is the error path loop or auxiliary path loop. Loop 2 contains the following circuit elements:

Main amplifier output sample coupler 26
Loop 2 group delay line 28
Main sampled signal attenuator 210 and associated RF interconnections 217
Carrier cancellation coupler 206
Error path input signal sample coupler 207
Distributed small signal gain stages 208
Group delay adjuster circuit 211
Phase 214 and amplitude 213 adjustment circuits
Error amplifier power module 34
Output Error Amplifier interconnection lines 216
Error injection coupler 42.

Loop 2 actions are controlled by operation of controller 230. As the case of Loop 1 the detected pilot signal is used to monitor and adjust loop 2 cancellation performance. Those skilled in the art will appreciate details of pilot requirements in order to control loop 2 performance and stability of circuits 211, 213 and 214. Pre-distortion circuit 104 is used under control of controller 230 by minimizing the detected pilot signal together to improve AM/AM and AM/PM performance due to higher output power levels. The use of a main path pre-distortion circuit thus improves IMD to carrier ratio at higher output power levels.

A preferred embodiment of the present invention of an RF power amplifier design which provides both high efficiency and minimal distortion in broad bandwidth RF applications has been described in relation to the various figures. Nonetheless, it will be appreciated by those skilled in the art that a variety of modifications and additional embodiments are possible within the teachings of the present invention. For example, a variety of specific feed forward circuit implementations and loop controller implementations may be provided employing the teachings of the present invention and limitations of space prevent an exhaustive list of all the possible circuit implementations or an enumeration of all possible control implementations. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. A feed forward amplifier, comprising:
an RF input for receiving an RF signal, the RF signal having randomly occurring signal peaks of high power;
a main amplifier receiving and amplifying said RF signal, said main amplifier biased in a first bias class of operation and having peak power capability less than some or all of said signal peaks of the RF signal so as to operate in a nonlinear mode near saturation for said signal peaks;
a main amplifier output sampling coupler;
a first delay coupled to the RF input and providing a delayed RF signal;
a carrier cancellation combiner coupling the delayed RF signal to the sampled output from the main amplifier to provide a distortion signal, said distortion signal having signal peaks corresponding to said nonlinear mode of said main amplifier;
an error amplifier receiving and amplifying the distortion signal output of the carrier cancellation combiner, said error amplifier biased in a second bias class of operation with higher linearity than said first bias class and peak power capability sufficient to amplify most or all of the signal peaks of the distortion signal without reaching saturation;
a second delay coupled to the output of the main amplifier;
an error injection coupler combining the output from the error amplifier and the delayed main amplifier output from the second delay so as to cancel distortion introduced by the main amplifier when operating in said nonlinear mode; and
an RF output coupled to the error injection coupler output and providing an amplified RF output.

2. A feed forward amplifier as set out in claim 1, wherein the ratio of main amplifier to error amplifier size is from 2 to 1.

3. A feed forward amplifier as set out in claim 1, wherein the ratio of main amplifier to error amplifier size is from 1 to 2.

4. A feed forward amplifier as set out in claim 1, wherein the first bias class of operation is class C or class AB2.

5. A feed forward amplifier as set out in claim 1, wherein the main amplifier comprises one or more semiconductor amplifier devices and wherein the device bias current in said first bias class of operation is between 0 and 0.17 percent of device saturation current.

6. A feed forward amplifier as set out in claim 1, wherein the main amplifier comprises one or more semiconductor amplifier devices and wherein the device bias current in said first bias class of operation is between 1.25 and 2.50 percent of device saturation current.

7. A feed forward amplifier as set out in claim 1, wherein the main amplifier and error amplifier comprise plural LDMOS amplifier devices.

8. A feed forward amplifier as set out in claim 1, wherein the second bias class of operation is class A or class AB1.

9. A feed forward amplifier as set out in claim 1, wherein the error amplifier comprises one or more semiconductor amplifier devices and wherein the device bias current in said second bias class of operation is between 3.33 and 10.00 percent of device saturation current.

10. A feed forward amplifier as set out in claim 1, wherein the error amplifier comprises one or more semiconductor amplifier devices and wherein the device bias current in said second bias class of operation is between 10.00 and 25.00 percent of device saturation current.

11. A feed forward amplifier as set out in claim 1, further comprising a pre-distortion circuit coupled to the input of the main amplifier.

12. A feed forward amplifier as set out in claim 11, further comprising a controller for controlling the operation of said pre-distortion circuit to minimize distortion at the amplifier RF output.

13. A feed forward amplifier as set out in claim 12, further comprising a pilot signal generator providing a pilot signal to the input of the main amplifier and a pilot signal detector coupled to the error injection coupler output and said controller.

14. A feed forward amplifier, comprising:
an RF input for receiving an RF input signal, said RF input signal having an average operating amplitude range and further comprising intermittent signal peaks in a peak range exceeding said average operating range;
a main amplifier receiving and amplifying said RF input signal, said main amplifier having a first transfer characteristic over its range of operation, said first transfer characteristic having a substantially linear portion corresponding to said average operating amplitude range of said RF input signal and a nonlinear portion corresponding to said RF input signal peak range;
a main amplifier output signal sampler;
an error path delay circuit coupled to the RF input and providing a delayed RF input signal;
a first cancellation combiner coupling the delayed RF input signal to the sampled output from the main amplifier;
an error amplifier for amplifying the output of the first cancellation combiner, said error amplifier having a second transfer characteristic over its range of operation, said second transfer characteristic having a linear portion corresponding to substantially all of said average and peak operating amplitude range of said RF input;
a main path delay circuit coupled to the output of the main amplifier;
a second cancellation combiner combining the output from the error amplifier and the output of the main path delay circuit so as to cancel distortion introduced by the main amplifier; and
an RF output coupled to the second cancellation combiner and providing an amplified RF output.

15. A feed forward amplifier as set out in claim 14, wherein said RF input signal comprises a spread spectrum signal having randomly occurring signal peaks which comprise said peak signal range.

16. A feed forward amplifier as set out in claim 15, wherein said RF input signal comprises a CDMA signal.

17. A feed forward amplifier as set out in claim 15, wherein said RF input signal comprises a WCDMA signal.

18. A feed forward amplifier as set out in claim 14, wherein the range of operation of the error amplifier is about 30 dB and the power vs gain transfer characteristic of the error amplifier is linear to less than 0.5 dB of gain through about 25 dB or more of the 30 dB operating range.

19. A feed forward amplifier as set out in claim 14, wherein the power vs gain transfer characteristic of the error amplifier is linear up to about −4 to −5 dB from peak device power.

20. A feed forward amplifier as set out in claim 14, wherein the average power range of operation of the error amplifier is about 10 dB.

21. A feed forward amplifier as set out in claim 14, wherein the range of the operation of said main amplifier is from about −20 dB from peak power to peak power and wherein said range of operation of said error amplifier is from about −30 dB from peak power to peak power.

22. A feed forward amplifier as set out in claim 14, further comprising a pre-distortion circuit coupled to the input of the main amplifier.

23. A feed forward amplifier as set out in claim 14, further comprising a controller for controlling the operation of said pre-distortion circuit to minimize distortion at the amplifier output.

24. A feed forward amplifier as set out in claim 14, further comprising a pilot signal generator providing a pilot signal to the input of the main amplifier and a pilot signal detector coupled to the amplifier output and said controller.

25. A method for amplifying a broad bandwidth RF input signal, comprising:
receiving an RF input signal, said RF input signal having an average operating amplitude range and further comprising intermittent signal peaks in a peak range exceeding said average operating range;
amplifying said RF input signal employing a main amplifier having a first transfer characteristic over its range of operation, said first transfer characteristic having a substantially linear portion corresponding to said average operating amplitude range of said RF input signal and a nonlinear portion corresponding to said RF input signal peak range;
sampling the main amplifier output;
delaying the RF input signal and providing a delayed RF input signal;
coupling the delayed RF input signal to the sampled output from the main amplifier so as to provide a distortion component of said sampled output from the main amplifier;
amplifying the distortion component employing an error amplifier having a second transfer characteristic over its range of operation, said second transfer characteristic having a linear portion corresponding to substantially all of said average and peak operating amplitude range of said RF input;
delaying the output of the main amplifier;
combining the amplified distortion component and the delayed output of the main amplifier so as to cancel distortion introduced by the main amplifier and providing an amplified RF output.

26. A method for amplifying a broad bandwidth RF input signal as set out in claim 25, wherein said RF input signal comprises a spread spectrum signal having randomly occurring signal peaks which comprise said peak signal range.

27. A method for amplifying a broad bandwidth RF input signal as set out in claim 25, further comprising pre-distorting said RF input signal prior to amplifying by said main amplifier.

28. A method for amplifying a broad bandwidth RF input signal as set out in claim 25, wherein the range of operation of the error amplifier is about 30 dB and the power vs gain transfer characteristic of the error amplifier is linear to less than 0.5 dB of gain through about 25 dB or more of the 30 dB operating range.

29. A method for amplifying a broad bandwidth RF input signal as set out in claim 25, wherein the power vs gain transfer characteristic of the error amplifier is linear up to about −4 to −5 dB from peak device power.

30. A method for amplifying a broad bandwidth RF input signal as set out in claim 25, wherein the average power range of operation of the error amplifier is about 10 dB.

31. A method for amplifying a broad bandwidth RF input signal as set out in claim 25, wherein the range of the operation of said main amplifier is from about −20 dB from peak power to peak power and wherein said range of operation of said error amplifier is from about −30 dB from peak power to peak power.

* * * * *